(12) United States Patent
Ranjan et al.

(10) Patent No.: US 8,058,696 B2
(45) Date of Patent: Nov. 15, 2011

(54) HIGH CAPACITY LOW COST MULTI-STATE MAGNETIC MEMORY

(75) Inventors: Rajiv Yadav Ranjan, San Jose, CA (US); Mahmud Assar, Aptos, CA (US); Parviz Keshtbod, Los Altos Hills, CA (US)

(73) Assignee: Avalanche Technology, Inc., Fremont, CA (US)

( * ) Notice: Subject to any disclaimer, the term of this patent is extended or adjusted under 35 U.S.C. 154(b) by 0 days.

(21) Appl. No.: 11/678,515

(22) Filed: Feb. 23, 2007

(65) Prior Publication Data

US 2007/0201265 A1    Aug. 30, 2007

Related U.S. Application Data

(63) Continuation-in-part of application No. 11/674,124, filed on Feb. 12, 2007.

(60) Provisional application No. 60/777,012, filed on Feb. 25, 2006.

(51) Int. Cl.
*H01L 29/82* (2006.01)
*G11C 11/00* (2006.01)

(52) U.S. Cl. .. 257/421; 365/158; 365/171; 257/E21.665

(58) Field of Classification Search ............... 257/421, 257/427, E21.665; 365/158, 171
See application file for complete search history.

(56) References Cited

U.S. PATENT DOCUMENTS

| | | | |
|---|---|---|---|
| 3,665,264 A | 5/1972 | Yukami et al. | |
| 5,060,098 A | 10/1991 | Gotoh et al. | |
| 5,695,864 A | 12/1997 | Slonczewski | |
| 6,072,718 A | 6/2000 | Abraham et al. | |
| 6,169,689 B1 | 1/2001 | Naji | |
| 6,285,581 B1 | 9/2001 | Tehrani et al. | |
| 6,365,419 B1 | 4/2002 | Durlam et al. | |
| 6,421,270 B1 | 7/2002 | Tai | |
| 6,469,926 B1 | 10/2002 | Chen | |
| 6,501,139 B1 | 12/2002 | Petti | |
| 6,590,806 B1 | 7/2003 | Bhattacharyya | |
| 6,603,677 B2 | 8/2003 | Redon et al. | |
| 6,639,312 B2 | 10/2003 | Herner et al. | |
| 6,642,595 B1 | 11/2003 | Hung et al. | |
| 6,649,451 B1 | 11/2003 | Vyvoda et al. | |
| 6,670,660 B2 * | 12/2003 | Hosotani ...................... | 257/295 |
| 6,697,294 B1 | 2/2004 | Qi et al. | |

(Continued)

FOREIGN PATENT DOCUMENTS

JP    2006295198    10/2006

(Continued)

OTHER PUBLICATIONS

T. Sek et al.; Spin-polarized current-induced magnetization reversal in perpendicularly magnetized L10-FePt layers; Applied Physics Letters; 88, 172504 2006 ; Apr. 25, 2006.

(Continued)

*Primary Examiner* — Anh Phung
*Assistant Examiner* — Allison P Bernstein
(74) *Attorney, Agent, or Firm* — Maryam Imam; IPxLAW Group LLP

(57) ABSTRACT

A multi-state current-switching magnetic memory element includes a stack of magnetic tunneling junction (MTJ) separated by a non-magnetic layer for storing more than one bit of information, wherein different levels of current applied to the memory element cause switching to different states.

15 Claims, 9 Drawing Sheets

U.S. PATENT DOCUMENTS

| | | | |
|---|---|---|---|
| 6,714,444 B2 | 3/2004 | Huai et al. | |
| 6,724,585 B2 | 4/2004 | Hayashi | |
| 6,743,642 B2 | 6/2004 | Costrini et al. | |
| 6,744,086 B2 | 6/2004 | Daughton et al. | |
| 6,759,263 B2 | 7/2004 | Ying et al. | |
| 6,783,999 B1 | 8/2004 | Lee | |
| 6,821,907 B2 | 11/2004 | Hwang et al. | |
| 6,893,893 B2 | 5/2005 | Nallan et al. | |
| 6,905,578 B1 | 6/2005 | Moslehi et al. | |
| 6,920,063 B2 | 7/2005 | Huai et al. | |
| 6,933,155 B2 | 8/2005 | Albert et al. | |
| 6,937,497 B1 * | 8/2005 | Ju et al. | 365/130 |
| 6,964,928 B2 | 11/2005 | Ying et al. | |
| 6,984,561 B2 | 1/2006 | Herner et al. | |
| 6,984,585 B2 | 1/2006 | Ying et al. | |
| 6,985,385 B2 | 1/2006 | Nguyen et al. | |
| 6,992,359 B2 | 1/2006 | Nguyen et al. | |
| 6,995,422 B2 | 2/2006 | Herner et al. | |
| 7,002,781 B2 | 2/2006 | Sugawara | |
| 7,005,730 B2 | 2/2006 | Verma et al. | |
| 7,009,877 B1 | 3/2006 | Huai et al. | |
| 7,018,878 B2 | 3/2006 | Vyvoda et al. | |
| 7,023,725 B2 | 4/2006 | Saito et al. | |
| 7,023,739 B2 | 4/2006 | Chen et al. | |
| 7,026,673 B2 | 4/2006 | Abraham | |
| 7,057,921 B2 | 6/2006 | Valet | |
| 7,088,609 B2 | 8/2006 | Valet | |
| 7,106,624 B2 | 9/2006 | Huai et al. | |
| 7,109,539 B2 | 9/2006 | Lu | |
| 7,120,049 B2 | 10/2006 | Nakamura et al. | |
| 7,123,498 B2 | 10/2006 | Miyatake et al. | |
| 7,126,201 B2 | 10/2006 | Matsutera et al. | |
| 7,148,531 B2 | 12/2006 | Daughton et al. | |
| 7,170,775 B2 | 1/2007 | Lin et al. | |
| 7,183,130 B2 | 2/2007 | Nuetzel et al. | |
| 7,345,852 B2 * | 3/2008 | Inomata et al. | 360/314 |
| 2002/0036331 A1 * | 3/2002 | Nickel et al. | 257/421 |
| 2002/0048128 A1 | 4/2002 | Kamiguchi et al. | |
| 2003/0108776 A1 | 6/2003 | Chang et al. | |
| 2003/0123200 A1 | 7/2003 | Nagasaka et al. | |
| 2003/0128483 A1 | 7/2003 | Kamijo | |
| 2003/0232223 A1 | 12/2003 | Leddy et al. | |
| 2004/0042128 A1 | 3/2004 | Slaughter et al. | |
| 2004/0130936 A1 | 7/2004 | Nguyen et al. | |
| 2004/0159832 A1 | 8/2004 | Hack | |
| 2004/0170055 A1 | 9/2004 | Albert et al. | |
| 2004/0201070 A1 | 10/2004 | Deak | |
| 2005/0045913 A1 | 3/2005 | Nguyen et al. | |
| 2005/0063222 A1 | 3/2005 | Huai et al. | |
| 2005/0105325 A1 | 5/2005 | Haneda et al. | |
| 2005/0133840 A1 | 6/2005 | Pietambaram et al. | |
| 2005/0167657 A1 | 8/2005 | Nickel et al. | |
| 2005/0195532 A1 | 9/2005 | Sugiyama et al. | |
| 2005/0201020 A1 | 9/2005 | Fuke et al. | |
| 2005/0207219 A1 | 9/2005 | Lee et al. | |
| 2005/0254287 A1 | 11/2005 | Valet | |
| 2005/0276996 A1 | 12/2005 | Hong et al. | |
| 2006/0017081 A1 | 1/2006 | Sun et al. | |
| 2006/0081953 A1 | 4/2006 | Nguyen et al. | |
| 2006/0083056 A1 | 4/2006 | Daughton et al. | |
| 2006/0104110 A1 | 5/2006 | Sun et al. | |
| 2006/0109591 A1 | 5/2006 | Ranjan et al. | |
| 2006/0114620 A1 | 6/2006 | Sbiaa et al. | |
| 2006/0141640 A1 | 6/2006 | Huai et al. | |
| 2006/0171198 A1 | 8/2006 | Saito et al. | |
| 2006/0187703 A1 | 8/2006 | Mizuguchi et al. | |
| 2006/0192237 A1 | 8/2006 | Huai | |
| 2006/0227465 A1 | 10/2006 | Inokuchi et al. | |
| 2006/0239066 A1 | 10/2006 | Liaw | |
| 2006/0268604 A1 | 11/2006 | Onogi et al. | |
| 2007/0007609 A1 | 1/2007 | Saito et al. | |
| 2007/0085068 A1 | 4/2007 | Apalkov et al. | |
| 2007/0086121 A1 | 4/2007 | Nagase et al. | |
| 2007/0164336 A1 | 7/2007 | Saito et al. | |
| 2007/0171694 A1 | 7/2007 | Huai et al. | |
| 2007/0253245 A1 | 11/2007 | Ranjan | |
| 2008/0043519 A1 | 2/2008 | Kitagawa et al. | |
| 2008/0094886 A1 | 4/2008 | Ranjan | |
| 2008/0164548 A1 | 7/2008 | Ranjan | |
| 2008/0180991 A1 | 7/2008 | Wang | |
| 2008/0191251 A1 | 8/2008 | Ranjan | |
| 2008/0191295 A1 | 8/2008 | Ranjan | |
| 2008/0225585 A1 | 9/2008 | Ranjan | |
| 2008/0246104 A1 | 10/2008 | Ranjan | |
| 2008/0253174 A1 | 10/2008 | Yoshikawa et al. | |
| 2008/0293165 A1 | 11/2008 | Ranjan | |
| 2009/0046501 A1 | 2/2009 | Ranjan | |
| 2009/0109739 A1 | 4/2009 | Ranjan | |

FOREIGN PATENT DOCUMENTS

| | | |
|---|---|---|
| JP | 2007073971 | 3/2007 |

OTHER PUBLICATIONS

Yingfan, Xu et al.; In situ ordering of FePt thin films with face-centered-tetragonal 001 texture on Cr100AxRux underlayer at low substrate temperature; Applied Physics Letters, vol. 80, No. 18, May 6, 2002.

S. Mangin et al.; Current-induced magnetization reversal in nanopillars with perpendicular anisotropy; Nature Materials; Mar. 2005; vol. 5.

F. J. Albert, et al.; Quantitative Study of Magnetization Reversal by Spin-Polarized Current in Magnetic Multilayer Nanopillars; Physical Review Letters; vol. 89, No. 22; Nov. 25, 2002.

Hao Meng, et al.; Current Confined Effect of Magnet Nano-Current-Channel for Magnetic Random Access Memory; The Center for Micromagnetics and Information Technology; Oct. 31, 2006.

L. Berge; Emission of spin waves by a magnetic multilayer traversed by a current; Physical Review; Oct. 1, 1996; vol. 54, No. 13.

G. D. Fuchs, et al.; Spin Torque, Tunnel-Current Spin Polarization, and Magnetoresistance in MgO Magnetic Tunnel Junctions; Physical Review Letters; PRL 96, 186603 (2006); May 12, 2006.

Jun Hayakawa; Current-Driven Magnetization Switching in CoFeB/MgO/CoFeB Magnetic Tunnel Junctions; Japanese Journal of Applied Physics; vol. 44, No. 41, 2005, pp. L 1267-L 1270.

Hao Meng, et al.; Composite free layer for high density magnetic random access memory with lower spin transfer current; Applied Physics Letters 89, 152509; Oct. 12, 2006.

Hao Meng, et al.; Low critical current for spin transfer in magnetic tunnel junctions; Applied Physics Letters; 88; Feb. 23, 2006.

G. D. Fuchs; Spin-transfer effects in nanoscale magnetic tunnel junctions; Applied Physics Letters; vol. 85, No. 7; Aug. 16, 2004.

J.C. Slonezewski; Current-driven excitation of magnetic multi-layers; Journal of Magnetism and Magnetic Materials; Dec. 19, 1995.

G. Consolo, et al.; Spin-torque switching in Py/Cu/Py and Py/Cu/CoPt spin-valve nanopillars; Journal of Magnetism and Magnetic Materials; Mar. 23, 2007.

F. J. Albert; Spin-polarized current switching of a Co thin film nanomagnet; Applied Physics Letters; vol. 77, No. 23; Dec. 4, 2000.

Xiaochun Zhu; Spin Torque and Field-Driven Perpendicular MRAM Designs Scalable to Multi-Gb/Chip Capacity; , vol. 42, No. 10, Oct. 2006.

C. J. Sun, et al.; Epitaxial L1o FePt magnetic thin films sputtered on Cu (001); Applied Physics Letters; vol. 82, No. 12; Mar. 24, 2003.

J. A. Katine et al.; Current-Driven Magnetization Reversal and Spin-Wave Excitations in CoCuCo Pillars; Physical Review Letters; vol. 84; Apr. 3, 2000.

Counterpart for China Application, 200880011839.8, CPEL0952038P.

Counterpart for European Application, EP 08729568.9.

Counterpart for Korean Application, 10-2009-7019022 Corresponding to PCT/US2008/053623.

Counterpart for China Application, 2008011854.2, CPEL0952060P.

Counterpart for European Application, EP08729570.5.

Counterpart for Korean Application, 10-2009-7019004 Corresponding to PCT/US2008/053625.

PCT/US2008/053623; WO 2008/100871.
PCT/US2008/053625; WO 2008/100872.
PCT/US2008/053619; WO 2008/100868.
PCT/US2008/053621; WO 2008/100869.
PCT/US2008/053624; WO 2009/058410.
PCT/US2008/065066; WO 2009/108212.

PCT/US2008/065067; WO 2009/108213.
PCT/US2008/080782; WO 2009/058634.
PCT/US2009/068586; WO 2010/080542.

* cited by examiner

MLC cell with two or more stacked MTJ with different anisotrophy.

| I density | 100 | n= 2 | | Parallel | Anti-parallel |
| Anisotrophy ratio | | 2 R(K Ω) large | | 1 | 2 |
| | Large | Small | R(K Ω) small | 2 | 4 |

| Fixed layers | Free layer 1 | Free layer 2 | State | Total R | Prog I (uA) |
|---|---|---|---|---|---|
| → | → | → | 1 | 3 | 200 |
| → | → | ← | 2 | 5 | -50 |
| → | ← | ← | 3 | 6 | -200 |
| → | ← | → | 4 | 4 | 50 |

Table 1

MLC cell with two or more MTJs side by side with different anisotrophy.

| I density | 50 | n= 2 | | Parallel | Anti-parallel |
|---|---|---|---|---|---|
| Anisotrophy ratio | | 1.3 | R(KΩ) large | 3 | 6 |
| | Small | Large | R(KΩ) small | 3.9 | 7.8 |

| Fixed layer | Free layer | Free layer | State | Total R | Prog I (uA) |
|---|---|---|---|---|---|
| → | → | → | 1 | 1.70 | -134.5 |
| → | → | ← | 2 | 2.36 | 50 |
| → | ← | ← | 3 | 3.39 | 134.5 |
| → | ← | → | 4 | 2.17 | -50 |

| From one state to another | | 1 to 2 | 2 to 3 | 3 to 4 |
|---|---|---|---|---|
| R differences | | 0.67 | 1.03 | 1.22 | 0.47 |
| between different states | | | | |

Table 2

FIG. 11

HIGH CAPACITY LOW COST MULTI-STATE MAGNETIC MEMORY

CROSS REFERENCE TO RELATED APPLICATIONS

This application claims priority to U.S. Provisional Application No. 60/777,012 filed on Feb. 25, 2006 and entitled "A High Capacity Low Cost Multi-State Magnetic Memory" and is a continuation-in-part of U.S. patent application Ser. No. 11/674,124 entitled "Non-Uniform Switching Based Non-Volatile Magnetic Base Memory", filed on Feb. 12, 2007, the disclosure of which is incorporated herein by reference, as though set forth in full.

BACKGROUND OF THE INVENTION

1. Field of the Invention

The present invention relates generally to non-volatile magnetic memory and particularly to multi-state magnetic memory.

2. Description of the Prior Art

Computers conventionally use rotating magnetic media, such as hard disk drives (HDDs), for data storage. Though widely used and commonly accepted, such media suffer from a variety of deficiencies, such as access latency, higher power dissipation, large physical size and inability to withstand any physical shock. Thus, there is a need for a new type of storage device devoid of such drawbacks.

Other dominant storage devices are dynamic random access memory (DRAM) and static RAM (SRAM) which are volatile and very costly but have fast random read/write access time. Solid state storage, such as solid-state-nonvolatile-memory (SSNVM) devices having memory structures made of NOR/NAND-based Flash memory, providing fast access time, increased input/output (IOP) speed, decreased power dissipation and physical size and increased reliability but at a higher cost which tends to be generally multiple times higher than hard disk drives (HDDs).

Although NAND-based flash memory is more costly than HDD's, it has replaced magnetic hard drives in many applications such as digital cameras, MP3-players, cell phones, and hand held multimedia devices due, at least in part, to its characteristic of being able to retain data even when power is disconnected. However, as memory dimension requirements are dictating decreased sizes, scalability is becoming an issue because the designs of NAND-based Flash memory and DRAM memory are becoming difficult to scale with smaller dimensions. For example, NAND-based flash memory has issues related to capacitive coupling, few electrons/bit, poor error-rate performance and reduced reliability due to decreased read-write endurance. Read-write endurance refers to the number of reading, writing and erase cycles before the memory starts to degrade in performance due primarily to the high voltages required in the program, erase cycles.

It is believed that NAND flash, especially multi-bit designs thereof, would be extremely difficult to scale below 45 nanometers. Likewise, DRAM has issues related to scaling of the trench capacitors leading to very complex designs which are becoming increasingly difficult to manufacture, leading to higher cost.

Currently, applications commonly employ combinations of EEPROM/NOR, NAND, HDD, and DRAM as a part of the memory in a system design. Design of different memory technology in a product adds to design complexity, time to market and increased costs. For example, in hand-held multimedia applications incorporating various memory technologies, such as NAND Flash, DRAM and EEPROM/NOR flash memory, complexity of design is increased as are manufacturing costs and time to market. Another disadvantage is the increase in size of a device that incorporates all of these types of memories therein.

There has been an extensive effort in development of alternative technologies such as Ovanic Ram (or phase-change memory), Ferromagnetic Ram (FeRAM), Magnetic Ram (MRAM), Nanochip, and others to replace memories used in current designs such as DRAM, SRAM, EEPROM/NOR flash, NAND flash and HDD in one form or another. Although these various memory/storage technologies have created many challenges, there have been advances made in this field in recent years. MRAM seems to lead the way in terms of its progress in the past few years to replace all types of memories in the system as a universal memory solution.

One of the problems with prior art memory structures is that the current and power requirements are too high to make a functional memory device or cell. This also poses a key concern regarding the reliability of such devices due to likely dielectric break-down of the tunneling barrier layer and thereby making it non-functional.

The challenge with other prior art techniques has been that the switching current is too high to allow the making of a functional device for memory applications due to the memory's high power consumption. Several recent publications, such as those cited below as references 5 and 6[5,6] have shown that the switching current can be reduced by having the memory element pinned by two anti-ferromagnetic (AF)-couple layers resulting in spin oscillations or "pumping" and thereby reducing the switching current.

An additionally known problem is using magnetic memory to store more than two states therein. To this end, multi-level or multi-state magnetic memory cells or elements for storing more than one bit of information do not exist.

What is needed is magnetic memory for storing more than one bit of digital information.

SUMMARY OF THE INVENTION

To overcome the limitations in the prior art described above, and to overcome other limitations that will become apparent upon reading and understanding the present specification, the present invention discloses a method and a corresponding structure for a magnetic storage memory device that is based on current-induced-magnetization-switching having reduced switching current in the magnetic memory.

Briefly, One embodiment of the present invention includes a multi-state current-switching magnetic memory element having a stack of magnetic tunneling junction (MTJ) separated by a non-magnetic layer for storing more than one bit of information, wherein different levels of current applied to the memory element cause switching to different states, each MTJ including a fixed layer, a barrier layer and a free layer. The switching current for the layers of each of the MTJs of the stack is different due to their aspect ratio or anisotropy, therefore the states of the free layers of each MTJ change independently of others by the application of different amounts of switching current.

These and other objects and advantages of the present invention will no doubt become apparent to those skilled in the art after having read the following detailed description of the preferred embodiments illustrated in the several figures of the drawing.

IN THE DRAWINGS

Figure 3:
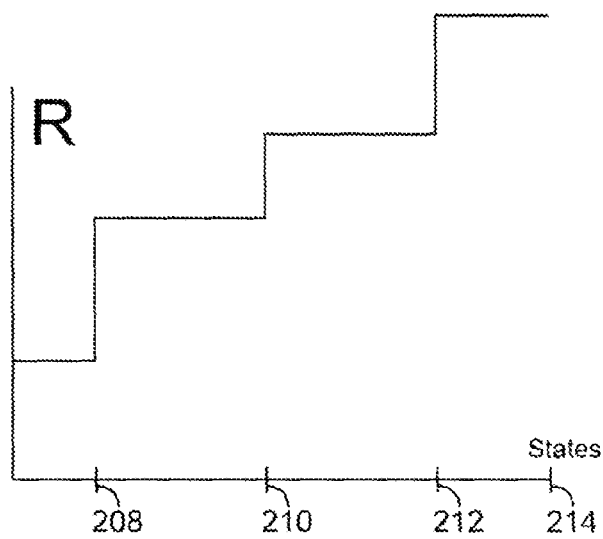

FIG. 3 shows a graph of the level of resistance (R) of each of the layers 118, 114, 110 and 106 (shown in the y-axis) vs. the state of the memory element 100.

Figure 4:
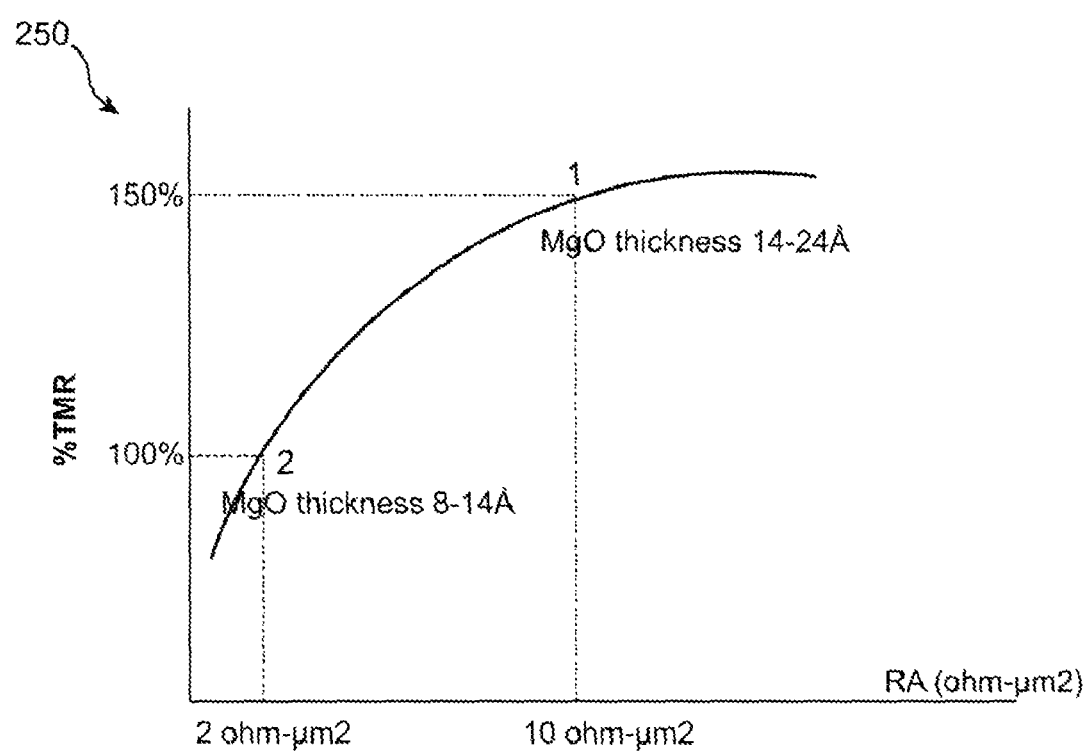
Figure 5:
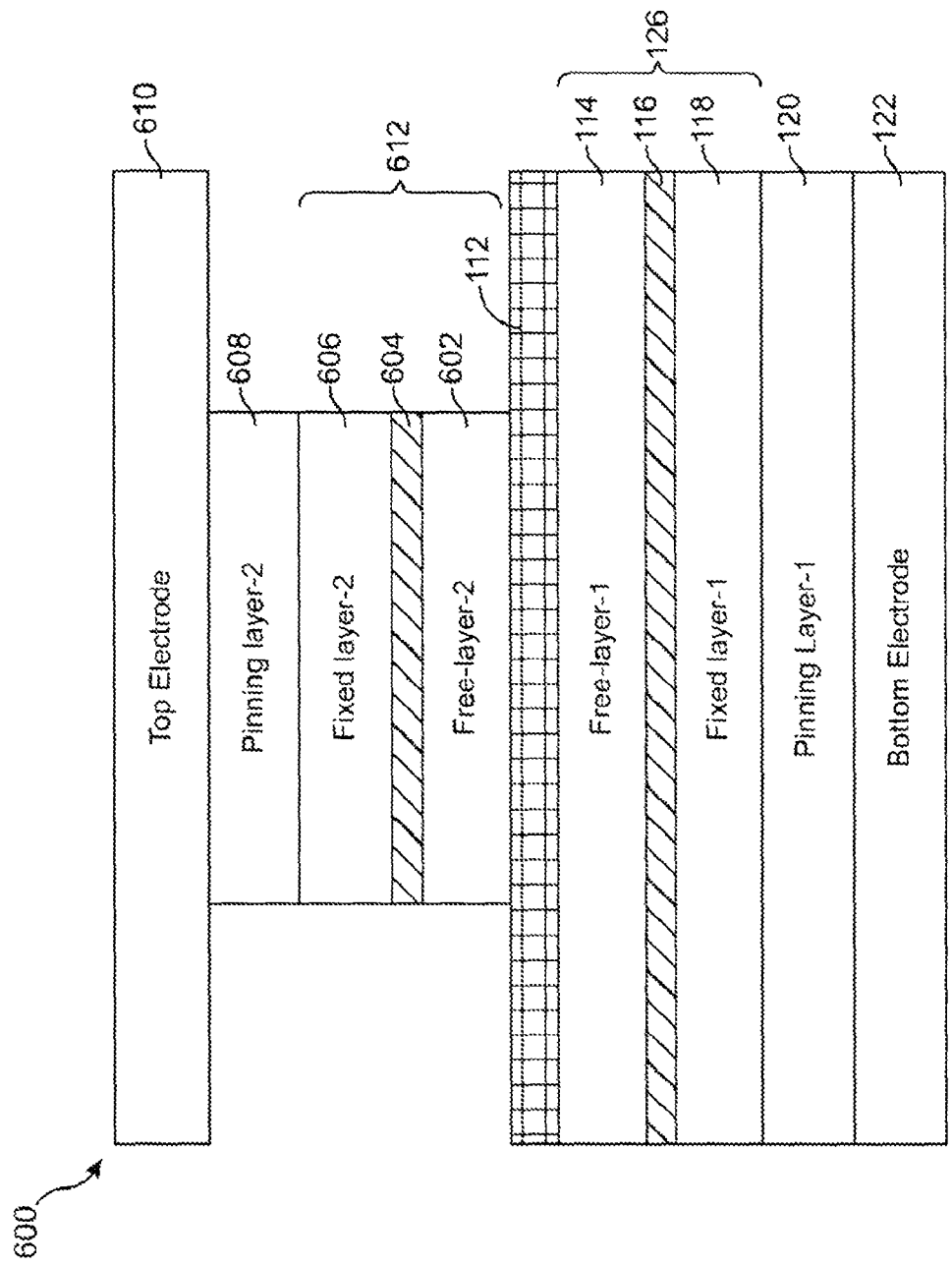

FIG. 4 shows a graph 250 of the tunneling magneto resistance (TMR), shown in the y-axis, vs. the resistance area (RA). FIG. 5 shows.

FIG. 5 shows relevant layers of a multi-state current-switching magnetic memory element 600 are shown, in accordance with another embodiment of the present invention.

Figure 6:
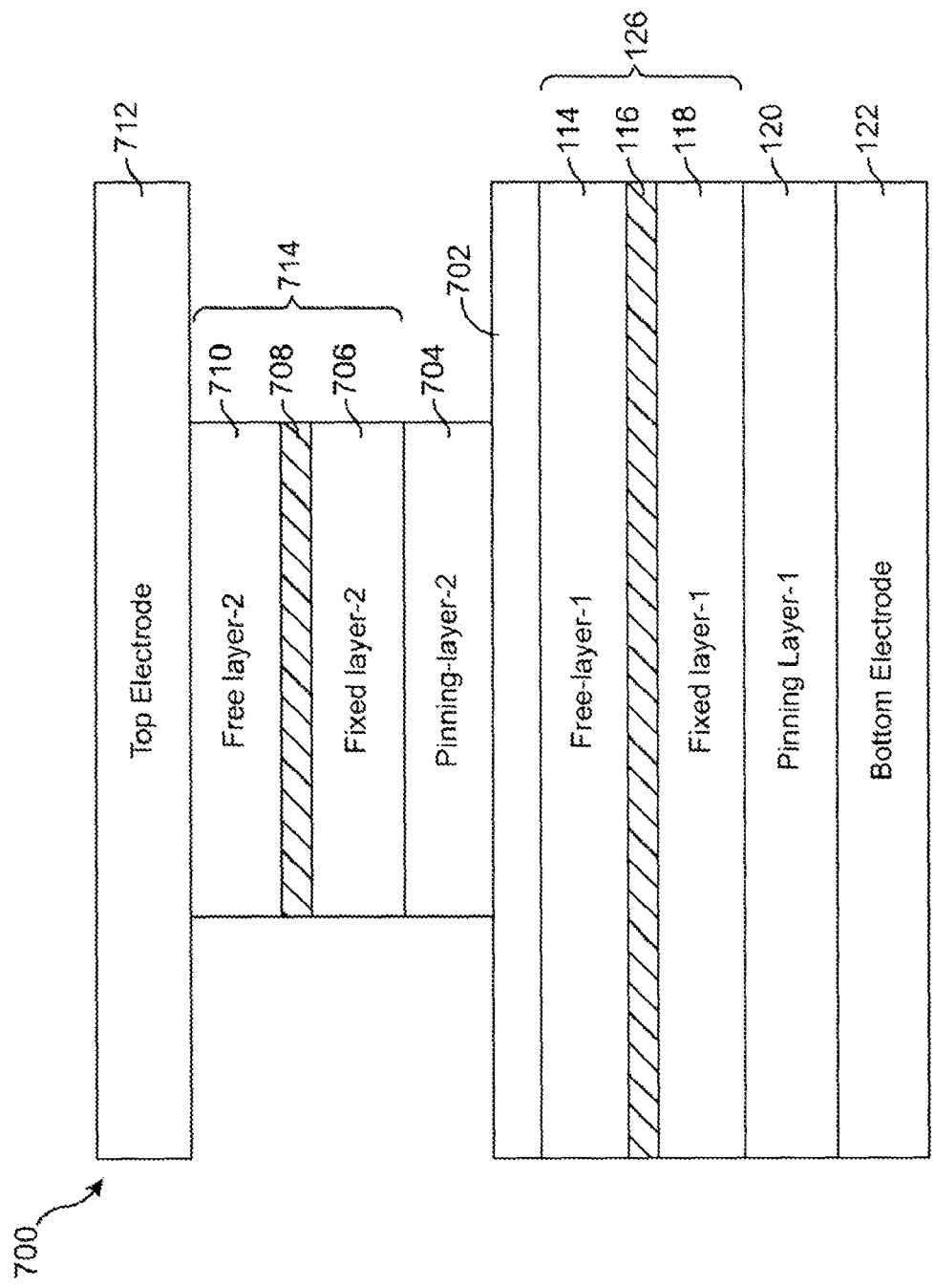

FIG. 6 shows relevant layers of a multi-state current-switching magnetic memory element 700, in accordance with yet another embodiment of the present invention.

Figure 7:
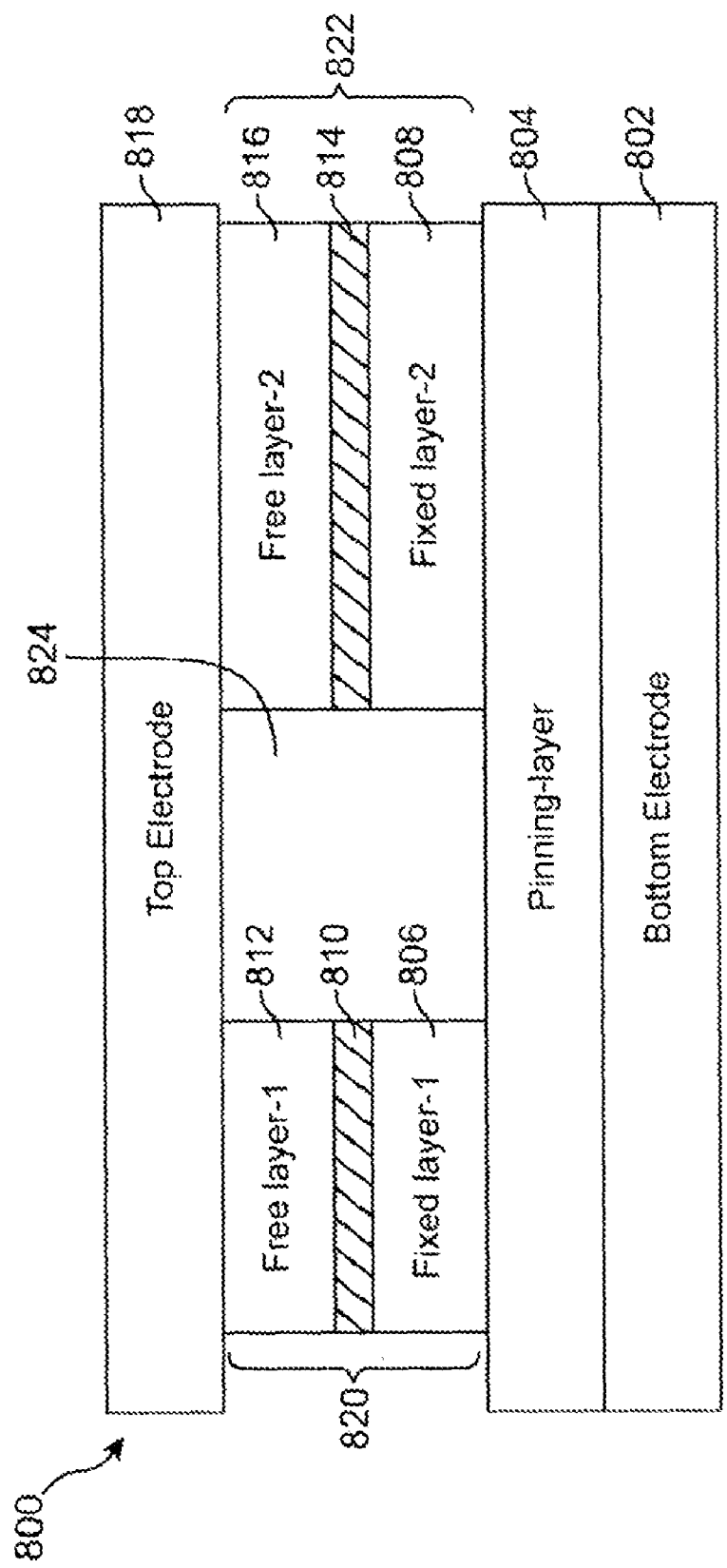

FIG. 7 shows relevant layers of a multi-state current-switching magnetic memory element 800, in accordance with still another embodiment of the present invention.

Figure 8:
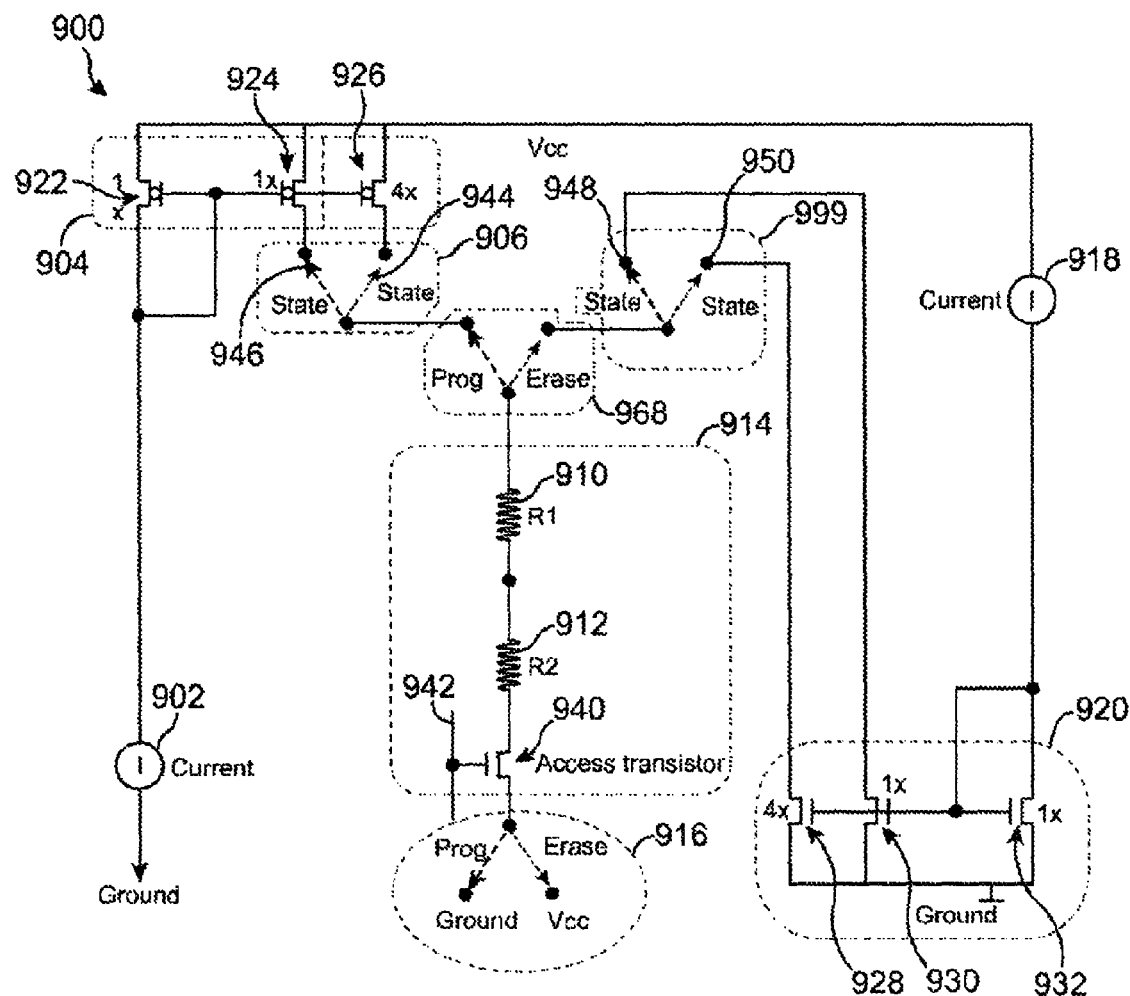

FIG. 8 shows a program/erase circuit for programming and/or erasing the memory elements of the various embodiments of the present invention.

Figures 9, 10:
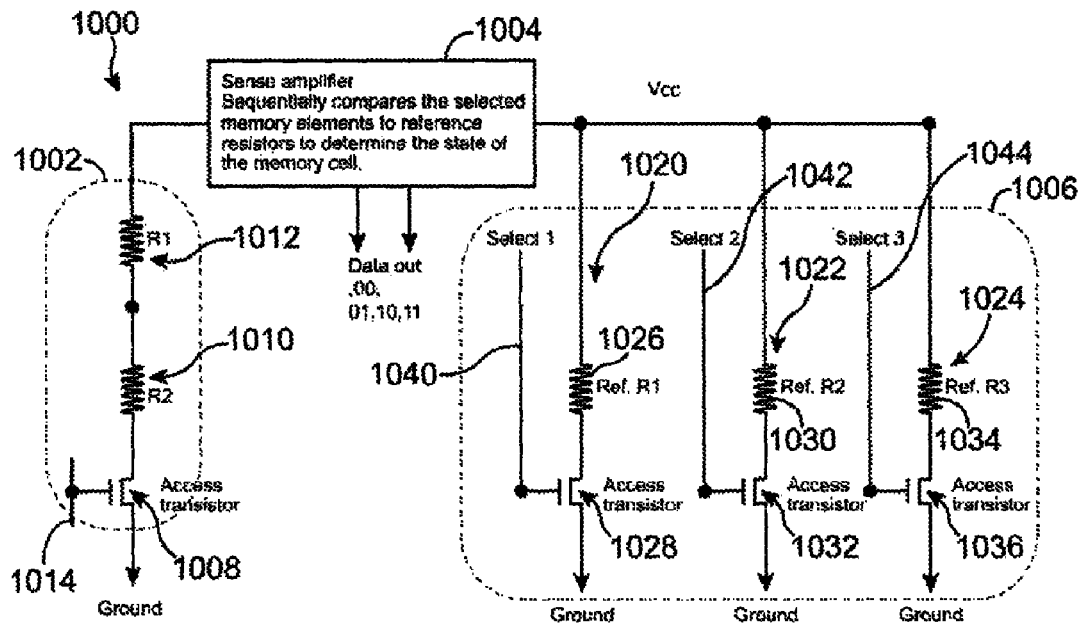

FIG. 9 shows a read circuit for reading the memory elements of the various embodiments of the present invention.

Figure 1:
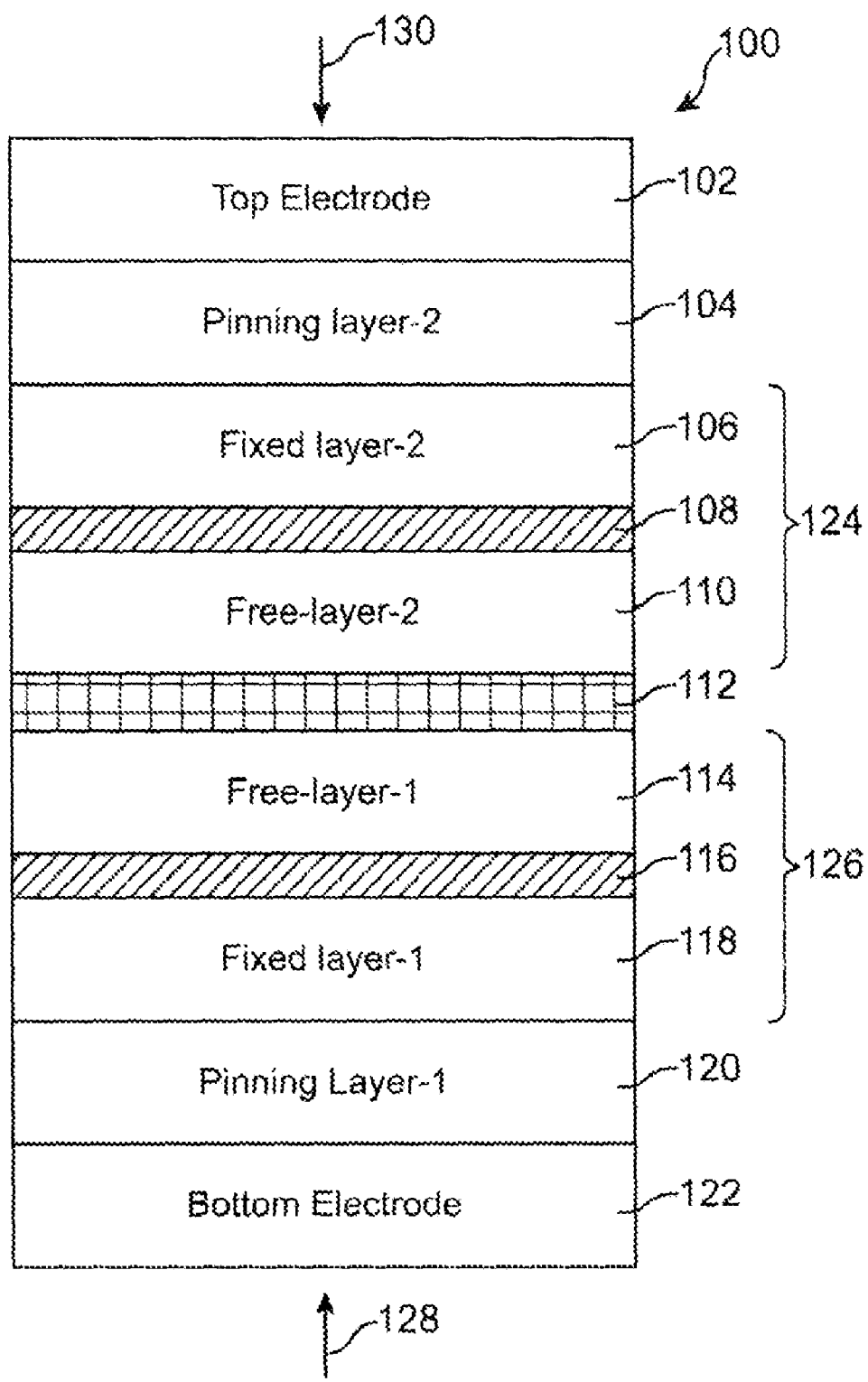
FIG. 1 shows relevant layers of a multi-state current-switching magnetic memory element 100 are shown, in accordance with an embodiment of the present invention.

FIG. 10 shows Table 1 that shows certain exemplary characteristics of the embodiments of FIGS. 1, 5 and 6.

FIG. 11 shows Table 2 that shows certain exemplary characteristics of the embodiment of FIG. 7.

DETAILED DESCRIPTION OF THE PREFERRED EMBODIMENT

In the following description of the embodiments, reference is made to the accompanying drawings that form a part hereof, and in which is shown by way of illustration of the specific embodiments in which the invention may be practiced. It is to be understood that other embodiments may be utilized because structural changes may be made without departing from the scope of the present invention.

In an embodiment of the present invention, a multi-state magnetic memory cell is disclosed. In one embodiment of the present invention, a stack of magnetic tunnel junctions (MTJ) is formed, each MTJ being formed of at least three layers: a barrier layer, a fixed layer, and a free layer. The barrier layer is formed between a fixed layer and a free layer, with each MTJ being separated from another by a conductive layer. The stack of MTJs forms a multi-state magnetic memory cell for storing at least two bits of digital information.

Referring now to FIG. 1, relevant layers of a multi-state current-switching magnetic memory element 100 are shown, in accordance with an embodiment of the present invention. The memory element 100 is shown to include a bottom electrode 122 on top of which is shown formed a pinning layer 120 on top of which is shown formed a fixed layer 118, on top of which is shown formed a barrier layer 116, on top of which is formed a free layer 114, on top of which is shown formed a non-magnetic layer 112, on top of which is shown formed a free layer 110, on top of which is shown formed a barrier layer 108, on top of which is shown formed a fixed layer 106, on top of which is shown formed a pinning layer 104, on top of which is shown formed a top electrode 102. The top electrode 102 and the bottom electrode 122 are each made of Tantalum (Ta) in an exemplary embodiment although other suitable materials are contemplated. The layers 114, 116 and 118 are shown to form a MTJ 126 separated by the layer 112 from an MTJ 124, which is formed from the layers 106, 108 and 110. The MTJ 124 and 126 form the relevant parts of a stack of memory elements. In fact, while two MTJs are shown to form the stack of FIG. 1, other number of MTJs may be stacked for storing additional bits of information.

In FIG. 1, the MTJ 126 is for storing a bit of information or two states, '1' and '0', while the MTJ 124 is for storing another bit of information and since each bit represents two binary states, i.e. '1' and '0', two bits represent four binary states, generally represented as '00', '01', '10', '11', or 0, 1, 2 and 3 in decimal notation, respectively. The memory element 100 advantageously stores two bits of information thereby decreasing the real estate dedicated for memory and further increases system performance. This is particularly attractive for embedded memory applications. Additionally, manufacturing is made easier and less costly and scalability is realized.

In FIG. 1, the barrier layers of each of the MTJs, such as the layer 116 acts as a filter for electrons with different spins giving rise to different amounts of tunneling current for electrons with different spins thereby causing two unique resistance values associated with each MTJ for two different orientations of the free layer. In the case where additional MTJs are employed, each MTJ similarly has associated therewith, a unique resistance value.

In one embodiment of the present invention, the thickness of the layers 108 and 116 cause the MTJs 124 and 126 to have different resistances and therefore capable of storing more than one bit.

Examples of materials used to form each of the layers of the memory element 100 will now be presented. It should be noted that these materials are merely examples and other types of materials may be employed. The layers 104 and 120, are each typically formed substantially of IrMn or PtMn or NiMn or any other material including Manganese (Mn). The layers 106 and 118 are typically formed substantially of a magnetic material. Examples of such magnetic material include CoFeB or CoFe/Ru/CoFeB. The layers 108 and 116 are each made substantially of a non-magnetic material, an example of which is magnesium oxide (MgO). The layer 112 is a non-magnetic layer made substantially of, for example, NiNb, NiP, NiV or CuZr. The layer 112 serves to insulate the two MTJs 124 and 126 from one another. In an embodiment employing more than two MTJs, another layer, such as the layer 112 would be formed on top of the layer 104 or on the bottom of the layer 120. The layers 110 and 114 are each made of CoFeB containing oxides intermixed. The layers 110 and 114 are substantially amorphous in an at-deposited state. The top electrode 102 and the bottom electrode 122 are each made of tantalum (Ta), in one embodiment of the present invention, however, other types of conductive material may be employed.

The layers 120 and 104 are anti-ferromagnetic (AF) coupling layers. More specifically, for example, the magnetic moment of the layer 104 helps to pin the magnetic moment of the layer 106. Similarly, the magnetic moment of the layer 120 serves to pin the magnetic moment of the layer 118. The magnetic moment of each of the layers 120 and 104 are permanently fixed.

Other choices of material for the layers 108 and 116 are aluminum oxide(Al2O3) and titanium oxide(TiO2). A thin-layer of one of the constituent elements may be deposited prior to the deposition of the barrier oxide layer. For example, a 2-5A thick Mg layer may be deposited prior to the deposition of the layers 108 and 116. This limits any damage of the magnetic- free layer from intermixing of the elements during deposition. The layer 112 is a non-magnetic layer which is substantially amorphous made of, for example, Nickel niobium(NiNb), Nickel phosphorous(NiP), Nickel vanadium (NiV), Nickel bororn(NiB) or copper -zirconium(CuZr). It should be noted that the composition of these alloys is chosen in such a way that the resulting alloy becomes substantially amorphous, for example, for nickel niobium(NiNb), the typical Nb content is maintained between 30 to 70 atomic percent and for nickel phosphorous(NiP) the phosphorous(P) content is maintained between 12 and 30 atomic percent. The layer 112 serves to isolate the two MTJs 124 and 126 from one another. In an embodiment of the present invention, which employs more than two MTJs, another layer, such as the layer 112 would be formed on top of the layer 104 or on the bottom of the layer 120. The layers 110 and 114 are each made of CoFeB containing oxides intermixed. The layers 110 and 114 are substantially amorphous in an as-deposited state. The top and the bottom electrodes are typically made of tantalum(Ta).

The layers 120 and 104 are anti-ferromagnetic (AF) coupling layers. More specifically, for example, the magnetic moment of the layer 104 helps to pin the magnetic moment of the layer 106. Similarly, the magnetic moment of the layer 120 serves to pin the magnetic moment of the layer 118. The magnetic moment of each of the layers 120 and 104 are permanently fixed. This is typically done by a magnetic annealing process following the deposition of all the layers and involves heating the wafer consisting of at least one memory element 100 under the application of a substantially uni-axial magnetic field of over 5 kilo-Oersteds and a temperature of over 350 degree centigrade for typically 2 hours. This annealing process also serves to re-crystallize the layers 108 and 116 and their respective adjacent free layers 110 and 114. This process is essential for making high performing magnetic tunnel junctions.

Typical thicknesses for each of the layers of the memory element 100 are now presented. However, these sizes are merely examples, as other thicknesses are anticipated. A typical thickness of each of the top electrode 102 and the bottom electrode 122 is 30 to 200 nm. While a preferred thickness is typically 50 nm, the actual thickness choice may depend on the requirements from the metallization process. The layers 104 and 120 are typically 20 to 100 nm in thickness with a preferred thickness of 25-50 nm. The layers 108 and 116 are typically made of three layers of Cobalt-Iron(CoFe)/Ruthenium(Ru)/Cobalt-Iron-Boron(CoFeB) with CoFe layer being placed adjacent to the layers 104 and 120. The typical thickness of the CoFe layer is 3 to 10 nm, Ru layer is 0.6 to 1.0 nm to create anti-ferromagnetic coupling between the two adjacent magnetic layers of CoFe and CoFeB. The CoFeB layer is typically 2 to 10 nm thick with a preferred range of 2.5 to 5 nm. The free layers 110 and 114 are typically 2 to 7 nm thick with a preferred range of 2-5 nm and may contain a 1-2 nm thick layer of Co-Fe-oxide inter-dispersed in that layer in order to get low switching current during current induced switching. The barrier layers 108 and 116 are typically 0.8 to 3 nm. It is very likely that the two barrier layers may have slightly different thickness, for example layer 116 can be 1.5 to 2.5 nm thick while the second barrier layer 108 may be 0.8 to 1.2 nm thick, and vice-versa. Additionally, the thickness and the amounts of oxide in the free-layers 110 and 114 may be different by a factor of 1.5 or higher. The amorphous isolation layer 112 is typically 2 to 50 nm thick with a preferred range being 2 to 10 nm. It should be pointed out that while the most preferred choice of the non-magnetic isolation layer is amorphous non-magnetic alloys, a crystalline non-magnetic alloy may also work.

During manufacturing, the layers of the memory element 100 are formed in the manner described hereinabove. Additionally, an annealing process, which is well known, is performed heating the memory element 100 in the presence of a magnetic field after which channels are formed in each of the layers 108 and 116. Following the annealing process, the fixed layers 106 and 118 are oriented in a particular orientation, and the layers 108 and 116, as well as the layers 110 and 114, take on crystalline characteristics.

During operation, current is applied, in a perpendicular direction relative to the plane of the paper of FIG. 1, either from a direction indicated by the arrow 128 or a direction indicated by the arrow 130. When current is applied, depending on the level of current, the magnetic moment of the layers 110 and 114 are each caused to be switched to an opposite direction, or not. Since the MTJs 124 and 126 are made with different aspect ratios (or anisotropy), the switching current is different for these two MTJs. For example, in one embodiment of the present invention, the aspect ratio for MTJ 124 is approximately 1:1.3 to 1:1.5 while the aspect ratio for the MTJ 126 is approximately 1:2 to 1:2.5. Therefore, the switching current for the MTJ 126 is 3-5 times higher than that of the MTJ 124, in the foregoing embodiment. At high current levels both MTJs switch magnetic orientation, while at low current levels only the MTJ 124 having the smaller aspect ratio switches.

The state of the magnetic moment of each of the layers of the MTJ defines the state of the memory element 100. As the layers 104 and 120 each act as AF coupling layers, they pin or switch the magnetic moments of the their neighboring fixed layer, which, then, by the application of current, causes neighboring free layers to switch or not. More specifically, the layer 118 defines one state, the layer 114 defines another state, the layer 110 defines yet another state and the layer 106 defines still another state. For the sake of understanding, the states of each of the layers 118, 114, 110 and 106 are referred to as states 1, 2, 3 and 4, respectively.

Figure 2:
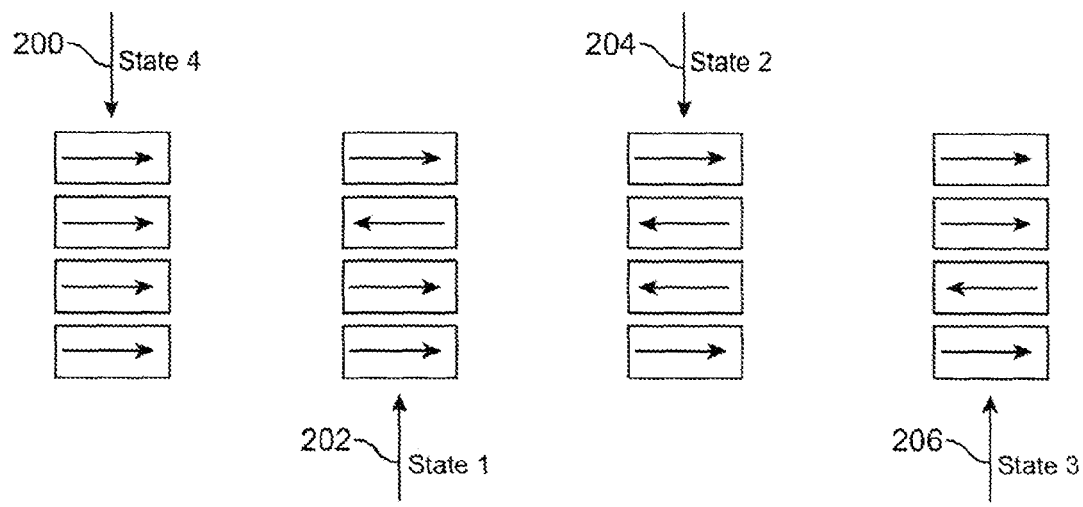
FIG. 2 shows various states of the memory element 100.

FIG. 2 shows various states of the memory element 100. Due to the use of two MTJs, four different states or two bits may be stored, therefore, the states 1-4 are shown. At each state, the directions of the arrows indicate the direction of the magnetic moments of free layers and pinning layers. The direction of the arrow 200 shows the direction of high current applied to the memory element 100 and in this case, the state of the memory element 100 is at an all '1's or all '0's state. The direction of the arrow 202 shows the direction of low current applied to the memory element 100 when at state 1. The direction of the arrow 204 shows the direction of high current applied to the memory element 100 when the latter is at state 2 and the direction of the arrow 206 shows the direction of low current applied to the memory element 100 when at state 3.

FIG. 3 shows a graph of the level of resistance (R) of each of the layers 118, 114, 110 and 106 (shown in the y-axis) vs. the state of the memory element 100. Thus, at, for example, at 208, the memory element 100 has taken on the state 1 (corresponding to 202 on FIG. 2), at 210, the memory element 100 has taken on the state 2 (corresponding to 204 on FIG. 2), at 212, the memory element 100 has taken on the state 3 (corresponding to 206 on FIG. 2), and at 214, the memory element 100 has taken on the state 4 (corresponding to 200 on FIG. 2). The level of resistance for each of these states is indicated in Table 1, at a column labeled "Total R". For example, at state 1, the R, in FIG. 3 is indicated as being 3 kilo ohms (K Ohms) by Table 1. At state 2, the R, in FIG. 3, is indicated as being 4 K Ohms and so on. The values used for resistance serve as examples only such that other values may be employed without departing from the scope and spirit of the present invention.

It should be noted that different aspect ratio or anisotropy associated with the different MTJs 124 and 126 causes the different switching of the MTJs, which results in two bits being stored in the memory element 100. In other embodiments, some of which will be shortly presented and discussed, the size of the barrier layers of the MTJs are changed to effectuate different resistances. In yet other embodiments, the size of the MTJs are changed to the same.

FIG. 4 shows a graph 250 of the tunneling magneto resistance (TMR), shown in the y-axis, vs. the resistance area (RA). The TMR is defined as:

$$TMR = (Rh - R1)/R1 \qquad \text{Eq. (1)}$$

Wherein Rh is resistance at a high state and R1 is resistance at a low state.

The graph 250 of FIG. 4 serves merely as an example to convey the difference in TMR or percentage increase as the RA increases. For instance, at an RA of 2 ohm-micro-meters squared, the TMR is 100% while at a RA of 10, the TMR is 150% where the thickness of the barrier layer of the MTJ is between 14-24 Angstroms.

FIG. 5 shows relevant layers of a multi-state current-switching magnetic memory element 600 are shown, in accordance with another embodiment of the present invention. The memory element 600 is shown to include a bottom electrode 122 on top of which is shown formed a pinning layer 120 on top of which is shown formed a fixed layer 118, on top of which is shown formed a barrier layer 116, on top of which is formed a free layer 114, on top of which is shown formed a non-magnetic layer 112, as that shown in FIG. 1. As previously indicated, relative to FIG. 1, the MTJ 126 comprises the layers 114, 116 and 118. However, in the embodiment of FIG. 5, the MTJ 612, which is made of a free layer 602, a barrier layer 604 and a fixed layer 606, is smaller, in its planar dimension, than the MTJ 126 of FIG. 1, which causes the MTJ 612 to have a different resistance than that of the MTJ 126.

In FIG. 5, the free layer 602 is shown to be formed on top of the layer 112 and on top of the layer 602 is shown formed the layer 604, on top of which is shown formed the layer 606, on top of which is shown formed a pining layer 608, a top electrode 610. The MTJs 126 and 612 are shown separated by the layer 112. The MTJs 126 and 612 form the relevant parts of a stack of memory elements. In fact, while two MTJs are shown to form the stack of FIG. 5, other number of MTJs may be stacked for storing additional bits of information.

The difference in the planar dimension of the MTJs 612 to that of the MTJ 126 is approximately 1 to 10 and typically 1 to 3, in one embodiment of the present invention. The material for each of the layers of the memory element 600 may be the same as that of counterpart layers of the memory element 100. For example, the layer 602 is made of the same material as that of the layer 110 and the layer 604 is made of the same material as that of the layer 108 and the layer 606 is made of the same material as the layer 106 and the layer 608 is made of the same material as the layer 104. The top electrodes 610 and 102 are made of the same material. In another embodiment, the MTJ 612 may be larger, in size, in the same planar dimension, than the MTJ 126.

The operation of the embodiment of the embodiment of FIG. 5 is the same as that of FIG. 1.

FIG. 6 shows relevant layers of a multi-state current-switching magnetic memory element 700, in accordance with yet another embodiment of the present invention. The memory element 700 to include a bottom electrode 122 on top of which is shown formed a pinning layer 120 on top of which is shown formed a fixed layer 118, on top of which is shown formed a barrier layer 116, on top of which is formed a free layer 114, on top of which is shown formed a non-magnetic layer 112, as that shown in FIGS. 1 and 6. As previously indicated, relative to FIGS. 1 and 6, the MTJ 126 comprises the layers 114, 116 and 118. However, in the embodiment of FIG. 6, the MTJ 714, which is shown to comprise a free layer 710, a barrier layer 708 and a fixed layer 706, is shown to be smaller in its planar dimension than the MTJ 126 causing the MTJ 714 to have a different resistance than that of the MTJ 126.

The MTJs 126 and 714 are shown separated by the layers 702 and 704. Although the layer 704 serves to pin the layer 706 while the layer 702 serves to isolate the MTJ 126 and is an amorphous only to the layer 114. The layer 702, in one embodiment of the present invention, is made of two non-magnetic layers, such as Ta and/or an amorphous alloy, the same as Nickel-niobium (NiNb) or nickel-phosphorus (NiP). The MTJs 126 and 612 form the relevant parts of a stack of memory elements. In fact, while two MTJs are shown to form the stack of FIG. 5, other number of MTJs may be stacked for storing additional bits of information.

The difference in the planar dimension of the MTJs 714 to that of the MTJ 126 is 1 to 10, and typically 1 to 3 in one embodiment of the present invention. The material for each of the layers of the memory element 700 may be the same as the counterpart layers of the memory element 100 or that of the memory element 600. For example, the layer 710 is made of the same material as that of the layer 110 and the layer 708 is made of the same material as that of the layer 108 and the layer 706 is made of the same material as the layer 106 and the layer 704 is made of the same material as the layer 104. The top electrodes 712 and 102 are made of the same material. In another embodiment, the MTJ 714 may be larger in size in the same planar dimension, than the MTJ 126.

FIG. 7 shows relevant layers of a multi-state current-switching magnetic memory element 800, in accordance with still another embodiment of the present invention. In FIG. 7, the memory element 800 is shown to include a bottom electrode 802 on top of which is shown formed a pinning layer 804 on top of which is shown formed two fixed layers on either side thereof. That is, a fixed layer 806 is shown formed on one side of the layer 804 and a fixed layer 808 is shown formed on an opposite side of the layer 804.

In FIG. 7, two MTJs are shown formed on either side or top of the layer 804. Namely, an MTJ 820 is shown formed on one side of the layer 804 and another MTJ 822 is shown formed on an opposite side of the layer 804. The MTJ 820 includes the fixed layer 806, which is formed on top of the layer 804 and the barrier layer 810 shown formed on top of the layer 806 and the free layer 812 shown formed on top of the layer 810. The MTJ 822 is shown to include the fixed layer 808, which is formed on top of the layer 804 and the barrier layer 814, which is shown formed on top of the layer 808 and the free layer 816, which is shown formed on top of the layer 814. A top electrode 818 is shown formed on top of the MTJs 820 and 822, or more specifically on top of the layers 812 and 816. The top electrode 818 is typically made of two layers, such as Ta and a conductive, non-magnetic material.

In forming the memory element 800, the layer 804 is formed on top of the bottom electrode and the layers of the MTJs 820 and 822 are formed on top of the layer 804 and on top of the MTJs 820 and 822 is formed the top electrode 818. The layers of the MTJs 820 and 822 are formed uniformly and continuously on top of the layer 804 and a trench 824, which is basically an empty space or hole is formed, prior to depositing the top electrode 818, by etching through the layers of the MTJs 820 and 822. In this manner, the fixed layers of the MTJs 820 and 822 are the same layer prior to etching and the barrier layers of the MTJs 820 and 822 are the same layer prior to etching and the free layers of the MTJs 820 and 822 are the same layer prior to etching.

In one embodiment of the present invention, the trench 824 is filled with a dielectric material, such as silicon dioxide (SiO2) or silicon nitride (SiNx) to enhance stability.

After etching, the top electrode 818 is deposited or formed on top of the MTJs 820 and 822. The embodiment of FIG. 7, as the embodiments of FIGS. 6, 5, and 1 store two bits of information, with one bit stored in each MTJ. Thus, the MTJ 820 is for storing one bit and the MTJ 822 is for storing another bit of information. However, more bits may be stored by adding MTJs. In FIG. 7, additional MTJs may be added on top of the layer 804 or the MTJs 820 and 822. With the addition of MTJs, beyond that which is shown in FIG. 7, additional notches or spaces are formed between the MTJs, such as the space or notch 824.

Table 2 shows certain exemplary characteristics of the embodiment of FIG. 7. It should be noted that similarly, Table 1 shows certain exemplary characteristics of the embodiments of FIGS. 1, 5 and 6.

For example, in Table 2, under the "Total R" column, there is shown the resistance at each state of the memory element 800, such as the state 1, the state 2, the state 3 and the state 4. As previously noted, each state represents a binary value such that four states, and represented by two bits are stored. The programming current, in micro amps, i.e. the current needed to program the memory element 800 to a given state, is indicated in the last column of Table 2, under the label "Prog I".

In an alternative embodiment of the present invention, a non-uniform switching based non-volatile magnetic memory element, such as the non-uniform switching based non-volatile magnetic memory element 100 disclosed in U.S. patent application Ser. No. 11/674,124 entitled "Non-Uniform Switching Based Non-Volatile Magnetic Base Memory", filed on Feb. 12, 2007, may be employed to replace the MTJs of the various embodiments shown and discussed herein. For example, the MTJ 124 or the MTJ 126 may be replaced with a non-uniform switching based non-volatile magnetic memory element. Other MTJs discussed herein may also be replaced with non-uniform switching based non-volatile magnetic memory element. This advantageously further reduces the requisite switching current to enhance system performance.

FIG. 8 shows a program/erase circuit for programming and/or erasing the memory elements of the various embodiments of the present invention. In FIG. 8, a current source 902 is shown coupled to a current mirror circuit 904, which is shown coupled to the switch 906, which is, in turn, shown coupled to the switch 968, which is shown coupled to the multi-state current-switching magnetic memory cell 914, which is shown coupled to the switch 916. Further shown in FIG. 8, a current source 918 is shown coupled to a current mirror circuit 920 and further shown coupled to Vcc on an opposite end thereto. The circuit 920 is further shown coupled to the switch 999.

The circuit 904 is shown to include a P-type transistor 922, a P-type transistor 924 and a P-type transistor 926. The source of each of the transistors 922, 924 and 926 are shown coupled to Vcc. Vcc is at a predetermined voltage level that is higher than ground. The gate of the transistor 922 is shown coupled to the current source 902 and the opposite side of the current source 902 is shown coupled to ground. The drain of the transistor 922 is shown coupled to its gate as well as to the gate of the transistor 924 and the gate of the transistor 926. The drains of the transistors 924 and 926 are shown coupled to the switch 906. The memory cell 914 is shown to include an MTJ 910, an MTJ 912 and an access transistor 940. The MTJ 912 is shown coupled in series to the MTJ 912, which is shown coupled to the drain of the transistor 940. The gate of the transistor 940 is shown coupled to the word line 942. The word line 942 selects a memory cell. The source of the transistor 940 is shown coupled to the switch 916.

The circuit 920 is shown to include an N-type transistor 928, an N-type transistor 930 and an N-type transistor 932. The drains of the transistors 928, 930 and 932 are shown coupled to ground. The gate of the transistor 932 is coupled to the current source 918 and is further coupled to the drain of the transistor 932 and is further coupled to the gate of the transistor 930 as well as to the gate of the transistor 928. The drain of the transistors 930 and 928 are shown coupled to the switch 999.

Each of the switches 908 and 916 are shown operative to switch between two states, a program state and an erase state. The switches 906 and 999 are shown operative to switch between two states.

The MTJs 910 and 912 are similar to the MTJs of previous figures, such as those depicted in FIGS. 1 and 6. In an alternative embodiment, the MTJs 910 and 912, coupled in parallel, would be similar to the MTJs shown in FIG. 7. Each MTJ 910 and 912 possesses a resistance of a different or unique value. The difference in their resistance results from the difference in the aspect ratio or size or anisotropy of the MTJs.

The size of the transistor 926 is greater than the size of the transistors 922 and 924. Similarly, the size of the transistor 928 is greater than the size of the transistors 930 and 932. In one embodiment of the present invention, the size difference of the foregoing transistors is 4 to 1. To explain the operation of programming, an example is provided with fixed values but it should be noted that these values may be altered without departing from the scope and spirit of the present invention.

In operation, to program the memory cell 914 to a state 1, a current of level of 50 micro Amps is applied by the current source 902 to the circuit 904, which is amplified to 4× the current level or 200 microAmps, as shown in Table 1 because the transistor 926 is able to drive this level of current. This causes the switch 906 to switch to the state indicated at 944. The switch 908 is set to 'program' state, as is the switch 916, which causes the 200 micro amp current to flow through the MTJs 910 and 912 and the transistor 940 is selected by raising the voltage on the word line 942. This results in programming of state 1. The magnetic moment of the free layers of the MTJs 910 and 912 will be caused to be aligned with the magnetic moment of that of their respective fixed layers. This results in the lowest resistance of the memory cell 914, as indicated in Table 1.

In programming the memory cell 914 to a state 2, a current of level of 50 micro Amps is applied by the current source 918 to the circuit 920, which is the same current level as that generated by the circuit 920. The current level for state 2 is indicated in Table 1. The switch 999 is caused to be switched to the state indicated at 948. The switches 908 and 916 are both set to 'erase' state, which causes the 50 micro amp current to flow through the MTJs 910 and 912 and the transistor 940 is selected by raising the voltage on the word line 942. This results in programming of state 2. The magnetic moment of the free layer of the MTJ 910 is caused to be switched to an anti-parallel state or a state that is in opposite to being aligned with its respective fixed layer. The MTJ 912 remains in the state it was in at state 1. The reason for this is, that in one embodiment of the present invention, with the aspect ratio of the MTJ 912 being higher than that of MTJ 910, it is prevented from switching. This results in the resistance of the memory cell 914 indicated in Table 1.

In programming the memory cell 914 to a state 3, a current of level of 50 micro Amps is applied by the current source 918 to the circuit 920, which causes the current level, generated by the transistor 928 to be 4 times that of the level of the current source, or 200 micro amps. The current level for state 3 is indicated in Table 1. The switch 999 is caused to be switched to the state indicated at 950. The switches 908 and 916 are both set to 'erase' state, which causes the 200 micro amp current to flow through the MTJs 910 and 912 and the transistor 940 is selected by raising the voltage on the word line 942. This results in programming of state 3. The magnetic moment of the free layers of the MTJs 910 and 912 are caused to be switched to an anti-parallel state relative to their respective fixed layers. This results in the resistance of the memory cell 914 to be that indicated in Table 1.

To program the memory cell 914 to a state 4, a current of level of 50 micro Amps is applied by the current source 902 to the circuit 904, which is the current level of the circuit 904 and that which is indicated in Table 1 for state 4. This causes the switch 906 to switch to the state indicated at 946. The switch 908 is set to 'program' state, as is the switch 916, which causes the 50 micro amp current to flow through the MTJs 910 and 912 and the transistor 940 is selected by raising the voltage on the word line 942. This results in programming of state 4. The magnetic moment of the free layer of the MTJ 910 will be caused to be aligned with the magnetic moment of that of its respective fixed layer. The MTJ 912 remains in its anti-parallel state, the reason for this is due the difference in the aspect ratios of the two MTJs as discussed hereinabove. This results in a resistance of the memory cell 914 indicated in Table 1.

FIG. 9 shows a read circuit for reading the memory elements of the various embodiments of the present invention. FIG. 9 is shown to include a memory cell 1002 coupled to a sense amplifier circuit 1004, which is shown coupled to a reference circuit 1006. The memory cell 1002 is shown to include an access transistor 1008, an MTJ 1010 and an MTJ 1012. The transistor 1008 is shown to have a drain, a source and a gate. The gate of the transistor 1008 is shown coupled to a word line 1014, the drain of the transistor is shown coupled to ground and the source of the transistor is shown coupled to the MTJ 1010.

It should be noted that wherever values are indicated herein, they are to merely serve as examples with the understanding that other suitable values are anticipated. It is further noted that while reference is made to an N-type or P-type transistor, either type or other suitable types of transistors may be employed, as the type of transistor indicated in the foregoing embodiments, merely serve as examples.

The circuit 1006 is shown to include a number of state reference circuits, indicated as state reference circuit 1020, 1022 and 1024. Each of the circuits 1020-1024 includes an access transistor and a reference resistor. For example, the circuit 1020 is shown to include a reference resistor 1026 coupled on one side to the circuit 1004 and Vcc and on the other side to the drain of an access transistor 1028. The gate of the transistor 1028 is shown coupled to a select signal, namely select 1 signal 1040.

Similarly, the circuit 1022 is shown to include a reference resistor 1030 coupled on one side to the circuit 1004 and Vcc and on the other side to the drain of an access transistor 1032. The gate of the transistor 1032 is shown coupled to a select signal, namely the select 2 signal 1042. The circuit 1024 is shown to include a reference resistor 1034 coupled on one side to the circuit 1004 and Vcc and on the other side to the drain of an access transistor 1036. The gate of the transistor 1044 is shown coupled to a select signal, namely the select 3 signal 1044.

The MTJs 1010 and 1012, as stated relative to FIG. 8, are similar to the MTJs of the embodiments of the present invention except that in the case of FIG. 7, the MTJs of the read circuit would be coupled in parallel rather than in series, shown in FIG. 9.

During a read operation, the memory cell 1002 is selected by raising the voltage of the word line 1014. The circuit 1004 compares the total resistance of the MTJs 1010 and 1012 with the resistances of the reference resistors of the state reference circuits. For example, the resistance of the MTJs 1010 and 1012 (collectively or added together) is compared to the resistance of the resistor 1026 and if it is determined to be less, the state of the memory cell 1002 is declared as binary value '00' or perhaps, state 1. However, if the resistance of the MTJs 1010 and 1012, collectively, is determined to be higher than that of the resistor 1026, the former is then compared to the resistance of the resistor 1030 and there again, if the resistance of the MTJs 1010 and 1012 is less than the resistor 1030, the state 2 or binary value '01'. If the resistance of the MTJs 1010 and 1012 is determined to be greater than the resistor 1030, the resistance of the MTJs 1010 and 1012 is compared to the resistance of the resistor 1034 and if the resistance of the former is determined to be lower, the state 3 or binary value '10' is declared (or read), otherwise, the state 4 or binary value '11' is declared.

The select signal of each of the circuits 1020-1024 are used to select the corresponding circuit. For example, to compare the resistance of the MTJs to the resistance of the resistor 1026, the signal 1040 is activated thereby turning on the transistor 1028. In the meanwhile, the remaining transistors of the circuit 1006 are off. Similarly, to compare the resistance of the MTJs to the resistance of the resistor 1030, the signal 1042 is activated thereby turning on the transistor 1032. In the meanwhile, the remaining transistors of the circuit 1006 are off. To compare the resistance of the MTJs to the resistance of the resistor 1034, the signal 1044 is activated thereby turning on the transistor 1036. In the meanwhile, the remaining transistors of the circuit 1006 are off.

Examples of resistance values of the reference resistors are averages of the resistances of the MTJs 1010 and 1012. For example, the resistance of the resistor 1026 is the average of the resistances of the MTJs 1010 and 1012 at the states 1 and 4, as indicated in Table 1. The resistance of the resistor 1030 is the average of the resistances of the MTJs 1010 and 1012 at the states 2 and 4, as indicated in Table 1. The resistance of the resistor 1034 is the average of the resistances of the MTJs 1010 and 1012 at the states 2 and 3, as indicated in Table 1. For example, in one embodiment of the present invention, the resistor 1026 has a resistance of 3.5 kilo-ohm, which is the average of 3 and 4 kilo-ohms. The resistance of the resistor 1030 is 4.5 kilo-ohms, which is the average of 5 and 4 kilo-ohms and the resistance of the resistor 1034 is 5.5 kilo-ohms, which is the average of 5 and 6 kilo-ohms.

In alternative embodiments of the present invention, the MTJs (or memory elements) disclosed in U.S. patent application Ser. No. 11/674,124 entitled "Non-Uniform Switching Based Non-Volatile Magnetic Base Memory", filed on Feb. 12, 2007, may be employed in the embodiments of FIGS. 8 and 9 herein.

It should be noted that the objects of the drawings or figures discussed and presented herein are not necessarily drawn to scale.

Although the present invention has been described in terms of specific embodiments, it is anticipated that alterations and modifications thereof will no doubt become apparent to those skilled in the art. It is therefore intended that the following claims be interpreted as covering all such alterations and modification as fall within the true spirit and scope of the invention.

What is claimed is:

1. A magnetic memory element comprising:
a stack of at least two magnetic tunneling junctions (MTJs), each of the at least two MTJs of the stack separated from another of the at least two MTJs of the same stack by a non-magnetic layer, the non-magnetic layer being amorphous, each of the at least two MTJs of the stack having a unique resistance associated therewith, the stack capable of storing more than one bit of information, each of the at least two MTJs including a barrier layer having a thickness associated therewith, each of the at least two MTJs further including a free layer and a fixed layer, the barrier layer of a first one of the at least two MTJs directly contacting and formed on top of the fixed layer of the first one of the at least two MTJs and the free layer of the first one of the at least two MTJs directly contacting and formed on top of the barrier layer of the of the first one of the at least two MTJs, the non-magnetic layer directly contacting and formed on top of the free layer of the first one of the at least two MTJs, the free layer of a second one of the at least two MTJs directly contacting and formed on top of the non-magnetic layer and the barrier layer of the second one of the at least two MTJs formed on top of the free layer of the second one of the at least two MTJs and the fixed layer of the second one of the at least two MTJs directly contacting and formed on top of the barrier layer of the second one of the at least two MTJs, the barrier layer of each of the at least two MTJs of the stack having a thickness that is different from the thickness of the barrier layers of all of the other MTJs of the stack, the thickness of the barrier layer of each of the at least two MTJs of the stack being at least in part indicative of the resistance of each of the MTJs of the stack, the non-magnetic layer being made of a material selected from a group comprising:
Nickel niobium(NiNb), Nickel phosphorous(NiP), Nickel vanadium(NiV), Nickel bororn(NiB) and copper-zirconium (CuZr), the stack being capable of storing one bit in each of the MTJs of the stack wherein when current is applied to the magnetic memory element, the multiple bits stored in the stack define the state of the stack and are based on the level of the current applied to the magnetic memory element so that when current is changed from one level to another, the state of the stack is switched accordingly.

2. A magnetic memory element, as recited in claim 1, wherein the aspect ratio of each of the MTJs is different than the aspect ratio of the other MTJs in the stack.

3. A magnetic memory element, as recited in claim 1, wherein the aspect ratio of the first one of the at least two MTJs of the stack to the second one of the at least two MTJs of the same stack is 1:10.

4. A magnetic memory element, as recited in claim 2, further including a first layer formed below and directly contacting the fixed layer of the first one of the at least two MTJs and a second pinning layer formed on top of and directly contacting the fixed layer of the second one of the at least two MTJs.

5. A magnetic memory element, as recited in claim 4, further including a bottom electrode on top of which is formed the first pinning layer, the first pinning layer directly contacting the bottom electrode.

6. A magnetic memory element, as recited in claim 5, further including a top electrode formed on top of and directly contacting the second pinning layer.

7. A magnetic memory element, as recited in claim 6, wherein the barrier layer of each of the at least two MTJs is made substantially of magnesium oxide (MgO).

8. A magnetic memory element, as recited in claim 7, wherein the fixed layer of each of the at least two MTJs is made substantially of a magnetic material.

9. A magnetic memory element, as recited in claim 1, wherein the barrier layer of each of the MTJs of the at least two MTJs made of material selected from a group comprising: aluminum oxide($Al_2O_3$) and titanium oxide($TiO_2$).

10. A magnetic memory element comprising:
a first magnetic tunneling junction (MTJ) formed on top of a bottom electrode, the first MTJ including a first fixed layer, a first barrier layer and a first free layer, the first fixed layer formed on top of the bottom electrode, the first barrier layer formed on top of and directly contacting the first fixed layer and the first free layer formed on top of and directly contacting the first barrier layer;
a non-magnetic layer formed on top of and directly contacting the first free layer and being amorphous and made of a material selected from a group comprising: Nickel niobium(NiNb), Nickel phosphorous(NiP), Nickel vanadium(NiV), Nickel bororn(NiB) and copper-zirconium(CuZr);
a second MTJ formed on top of and directly contacting the non-magnetic layer, the second MTJ comprising a second fixed layer, a second barrier layer and a second free layer, the second free layer formed on top of and directly contacting the non-magnetic layer, the second barrier layer formed on top of and directly contacting the second free layer and the second fixed layer formed on top of and directly contacting the second barrier layer, the first and second MTJs configured to store more than one bit of information; and
a top electrode formed on top of the second MTJ, the first and second barrier layers each having a thickness associated therewith the first and second free layers being capable of switching between two magnetic orientations indicative of the state of the corresponding MTJ, the first barrier layer having a thickness that is different from the thickness of the second barrier layer, the thickness of the barrier layer of each of the first and second MTJs being at least in part indicative of the resistance of the other one of the first and second MTJs,
wherein upon the flow of current through the magnetic memory element, the first and second MTJs are caused to store more than one bit based on the level of the current flowing therethrough so that when current is changed from one level to another, the state of the first and second MTJs is switched accordingly.

11. A magnetic memory element, as recited in claim 10, further including a first pinning layer formed between the bottom electrode and the first MTJ, the first pinning layer directly contacting the bottom electrode and the first fixed layer.

12. A magnetic memory element, as recited in claim 10, wherein the first and second barrier layers are each made substantially of magnesium oxide (MgO).

13. A magnetic memory element, as recited in claim 12, wherein the first and second fixed layers are made substantially of a magnetic material.

14. A magnetic memory element, as recited in claim 13, further including more than two MTJs thereby causing the current-switching magnetic memory element to switch to more than four states.

15. A magnetic memory comprising:

at least two magnetic tunneling junctions (MTJs) separated from another by a non-magnetic layer, the non-magnetic layer being amorphous and made of a material selected from a group comprising: Nickel niobium(NiNb), Nickel phosphorous(NiP), Nickel vanadium(NiV), Nickel bororn(NiB) and copper-zirconium(CuZr), each of the at least two MTJs having a unique resistance associated therewith, each of the at least two MTJs including a barrier layer having a thickness associated therewith, each of the at least two MTJs further including a free layer and a fixed layer, a first one of the at least two MTJs including a Mg layer formed on top of the fixed layer of the first one of the at least two MTJs and below the barrier layer of the first one of the at least two MTJs and a second one of the at least two MTJs including a second Mg layer formed on top of the free layer of the second one of the at least two MTJs and below the barrier layer of the second one of the at least two MTJs, the free layer of the first one of the at least two MTJs formed on top of the barrier layer of the first one of the at least two MTJs and the barrier layer of the second one of the at least two MTJs being formed between the free layer and the fixed layer of the second one of the at least two MTJs, the non-magnetic layer directly contacting and formed on top of the free layer of the first one of the at least two MTJs, the free layer of the second one of the at least two MTJs directly contacting and formed on top of the non-magnetic layer and the fixed layer of the second one of the at least two MTJs directly contacting and formed on top of the barrier layer of the second one of the at least two MTJs, the barrier layer of each of the at least two MTJs having a thickness that is different from the thickness of the barrier layers of the other MTJs of the at least two MTJs, the thickness of the barrier layer of each of the at least two MTJs being at least in part indicative of the resistance of each of the MTJs of the at least two MTJs, the at least two MTJs being capable of storing one bit in each of the MTJs thereof wherein when current is applied to the magnetic memory element, the multiple bits stored in the at least two MTJs define the state of thereof and are based on the level of the current applied to the magnetic memory element so that when current is changed from one level to another, the state of the at least two MTJs is switched accordingly.

\* \* \* \* \*